United States Patent [19]

Tabuchi et al.

[11] 4,259,436
[45] Mar. 31, 1981

[54] METHOD OF MAKING A TAKE-CARRIER FOR MANUFACTURING IC ELEMENTS

[75] Inventors: Seiichi Tabuchi, Yokohama; Shinichi Wakabayashi, Samizumura, both of Japan

[73] Assignee: Shinko Electric Industries Co., Ltd., Nagano, Japan

[21] Appl. No.: 32,666

[22] Filed: Apr. 23, 1979

[30] Foreign Application Priority Data

Apr. 26, 1978 [JP] Japan ................................ 53-49430

[51] Int. Cl.³ .................. B44C 1/22; C03C 15/00; C03C 25/06; C23F 1/02
[52] U.S. Cl. .................... 430/314; 29/576 S; 156/634; 156/661.1; 156/630; 174/52 R; 357/70; 430/312; 430/313; 430/318
[58] Field of Search .............. 29/576 S, 577 C, 591; 357/69, 70; 174/52 R, 52 PE, 52 FP; 156/629-634, 654-656, 659-661, 664-666, 661.1, 659.1; 96/36.2, 38.4; 430/312-314, 318

[56] References Cited

U.S. PATENT DOCUMENTS

| | | | |
|---|---|---|---|
| 3,838,984 | 10/1974 | Crane et al. | 174/52 PE |
| 4,049,903 | 9/1977 | Kobler | 174/68.5 |
| 4,052,787 | 10/1977 | Shaheen et al. | 156/634 X |

*Primary Examiner*—William A. Powell
*Attorney, Agent, or Firm*—Staas & Halsey

[57] ABSTRACT

A method of making a tape-carrier for manufacturing IC elements comprising: (A) a resist coating process for coating a resist onto both surfaces of a metallic foil; (B) a resist patterning process for removing the resist from the portions on one surface of the metallic foil where the terminals of an IC chip are to be positioned, and for removing the resist from an outer region of an area on the other surface of the metallic foil where lead terminals are to be formed; (C) a plating process for plating the portions, where the resist are removed from the one surface of the metallic foil, with a metal so as to form metallic bumps on the metallic foil; and (D) an etching process for etching the outer region of the area where the lead terminals are to be formed, so that each of the lead terminals has a bump formed on the end portion thereof.

9 Claims, 7 Drawing Figures

METHOD OF MAKING A TAKE-CARRIER FOR MANUFACTURING IC ELEMENTS

BACKGROUND OF THE INVENTION

1. Field of the Invention:

The present invention relates to a method of making a tape-carrier for manufacturing IC elements, the tape-carrier comprising a flexible tape of an insulation material and a metal foil adhering to the tape. The present invention relates more particularly to a method of making a tape-carrier which is provided with a metallic bump on the end portion of each lead terminal in order to bond an IC chip easily with the lead terminals of the tape-carrier.

2. Description of the Prior Art:

One of the conventional methods for connecting each terminal of an IC chip with a corresponding lead terminal of a lead frame is to connect them discretely with a wire. However, such method takes much time and labor.

Another method is to use a tape-carrier which comprises a flexible tape of an insulation material and a metallic foil adhering to one surface of the tape. The metallic foil is etched or punched to have a plurality of lead terminals. The tape has a row of sprocket holes along each side edge thereof for positioning the tape-carrier accurately into a bonding station where an IC chip is bonded onto the lead terminals. After bonding, the tape-carrier is fed to another processing station by a sprocket wheel which engages with the sprocket hole. In this method, the IC chip is positioned on the lead terminals through a center hole of the tape. Thereafter, all of the terminals of the IC chip are bonded simultaneously to the lead terminals by a thermo-compression gang-bonding means. The IC chip used in the above-mentioned method heretofore is provided with terminal bumps each of which is placed on a corresponding lead terminal during the gang-bonding process. However, forming such terminal bumps on the IC chip makes it complicated to manufature the IC chip, thus causing an increase in the percentage of defective IC chip products and an increase in the cost of producing the IC chip.

The size of the average lead terminal is about 100 μm in width and about 35 μm in thickness. It is difficult to form a bump on the end of such a small lead terminal in a prescribed position with a high degree of accuracy after the lead terminals are constructed.

A bump can be formed on the end of each lead terminal of a lead frame by using a known IC element manufacturing process in which the above-mentioned tape-carrier is not used. This known process is disclosed in Japanese Patent Publication Sho. No. 45-40740. However, the conventional process is complicated because the lead frame comprises many layers of various metals, each layer being treated by an etching process. Therefore, the possibility of mis-alignment of each layer is increased.

SUMMARY OF THE INVENTION

It is an object of the present invention to provide a method of making a tape-carrier for manufacturing IC elements, in which the IC chip which has no bumps thereon can be bonded to lead terminals by using a thermo-compression gang-bonding means. Therefore, in the present invention, bumps are formed on a metallic foil before the metallic foil is etched for forming the lead terminals.

A method of making a tape-carrier for manufacturing IC elements according to the present invention comprises:

(A) a resist coating process for coating a resist onto both surfaces of a metallic foil;

(B) a resist patterning process for removing the resist from the portions on a first surface of the metallic foil where the terminals of an IC chip are to be positioned, and for removing the resist from an outer region of the area on the second surface of the metallic foil where the lead terminals are to be formed;

(C) a plating process for plating the portions where the resist is removed from the above-mentioned first surface of the metallic foil so as to form metallic bumps on the metallic foil; and (D) an etching process for etching the outer region of the area where the lead terminals are to be formed, so that each of the lead terminals has a bump formed on the end portion thereof.

DETAILED DESCRIPTION OF PREFERRED EMBODIMENTS

Figure 1:
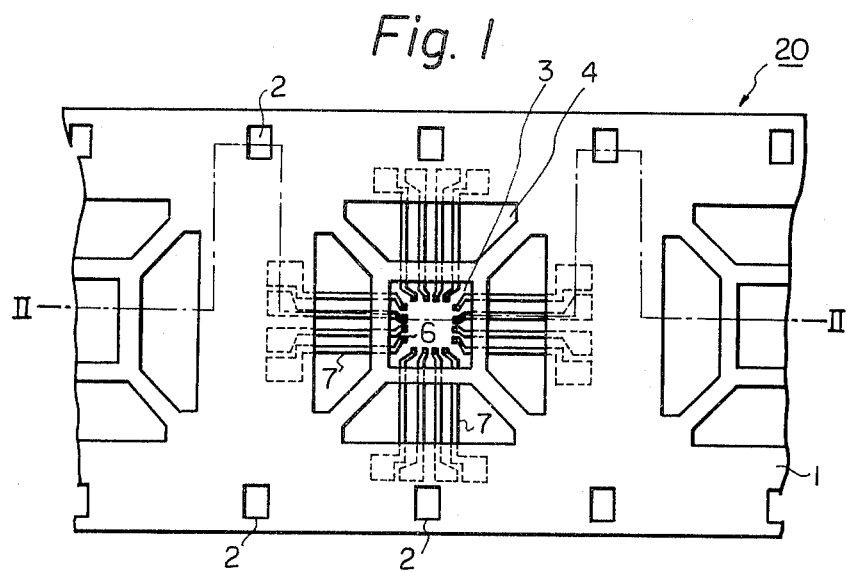
FIG. 1 is a plan view of an example of a tape-carrier according to the present invention.
Figure 2:
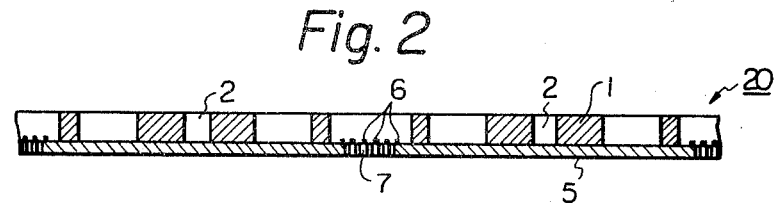
FIG. 2 is a sectional view along the line II—II in FIG. 1, according to one process of manufacturing the tape-carrier.

A tape-carrier 20 manufactured by a method according to the present invention is illustrated in FIG. 1. A flexible insulation tape 1 of polyimide is of about 100 μm in thickness and has an adhesive agent on its undersurface. The tape 1 has a row of center holes 3 and a row of sprocket holes 2 along each edge thereof. Four trapezoidal holes 4 are formed around the center hole 3.

The tape-carrier 20 is manufactured as follows.

A copper foil of about 35 μm in thickness is processed by a cutting machine so that it has a width slightly narrower than the length between the inside edge of a sprocket hole 2 of one tape edge and the inside edge of a corresponding sprocket hole 2 of the other tape edge. Then the copper foil strip is bonded to the lower surface of the aforementioned tape 1 so as to form a strip assembly. After that, both surfaces of the strip assembly are coated with a photosensitive resist. The thickness of the resist layer is about 10 to 15 μm. Then, an exposure process is carried out as follows. A mask having a bump pattern and a mask having a pattern of finger-like lead terminals are positioned so that the mask surfaces are facing each other with a gap between them for feeding the strip assembly between the masks. The two masks are aligned accurately with each other with the aid of a magnifying device. The strip assembly is conveyed into the gap by a feeding device such as a sprocket wheel which engages with the sprocket holes fromed on the tape. After positioning the strip assembly in a prescribed position, the gap is reduced until the masks contact the strip assembly. It is preferable to evacuate the air in the gap by means of a vacuum device so that the masks can be attached to the strip assembly with a high degree of accuracy. After that, the resist layers on both surfaces of the strip assembly are exposed through the masks, respectively. Either a positive type resist or a negative type resist can be used. Then, by means of a developing device, each of the resist layers is developed into the shape of the pattern of the corresponding mask. Therefore, on the upper surface of the copper foil strip, the resist is removed, and the copper strip is partially exposed in the shape of a bump at each position where the terminal of an IC chip is to be positioned; while on the lower surface of the copper foil strip, the resist is left in the shape of finger-like lead terminals 7 as illustrated in FIG. 1.

Figure 3:
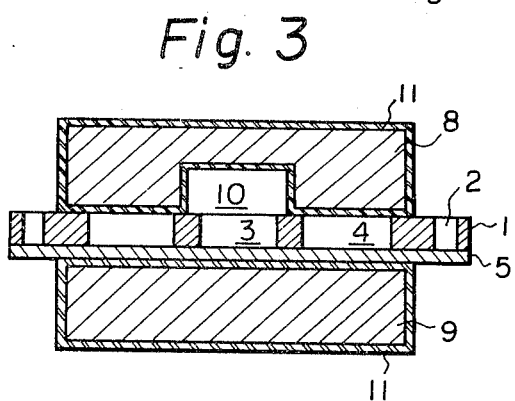
FIG. 3 is a sectional view of a high speed plating device.

Then, the strip assembly is plated by means of a high speed plating device which comprises an upper vinyl chloride sheet 8 and a lower vinyl chloride sheet 9 as illustrated in FIG. 3. The width of the upper and lower vinyl chloride sheets 8, 9 are narrower than that of the strip assembly 20. Each of the sheets 8, 9 is coated with a silicone rubber layer 11 for creating a tight contact between the sheets 8, 9 and the strip assembly 20. The upper vinyl chloride sheet 8 has a groove 10 along the longitudinal center thereof. A plating solution is supplied within the groove 10 so that the exposed portions of the copper foil 5 within the center hole 3 are plated so as to form bumps on the copper foil 5. Preferably, the copper foil 5 is plated with gold. After plating the strip assembly, the sheets 8, 9 are removed.

Then, the strip assembly 20 is immersed in an etching solution. The bumps 6 of gold are not etched. The upper surface of the copper foil 5 is not etched because it is covered with resist and gold. The copper foil 5 is etched from the under surface to the inside of the foil so that finger-like lead terminals 7 are formed, each of which is provided with a gold bump 6 on its end portion within the center hole 3 of the tape 1 (FIG. 1). Thereafter, the resist is removed thus completing the process of manufacturing the tape-carrier 20 which has bumps 6 for bonding the IC chip terminals to the lead terminals.

Figure 4:
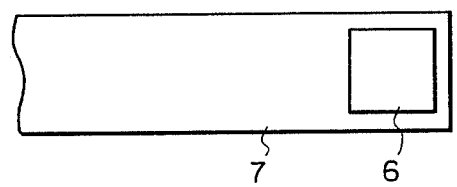
FIG. 4 is an enlarged plan view of an end of a lead terminal.
Figure 5:
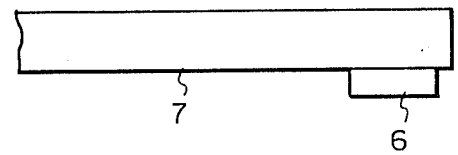
FIG. 5 is a side view of the lead terminal illustrated in FIG. 4.

The end portion of the lead terminal 7 on which the bump 6 is formed is illustrated in FIG. 4 and FIG. 5.

In the above-mentioned manufacturing process of the tape-carrier, the strip assembly is fed automatically and positioned in a prescribed with a high degree of accuracy with the aid of a feed device such as a sprocket wheel, because the tape 1 has a row of sprocket holes located at regular intervals along each edge thereof. Each bump is formed on the ends of the lead terminal with a high degree of accuracy. Each process can be automatically carried out in sequence.

Figure 6:
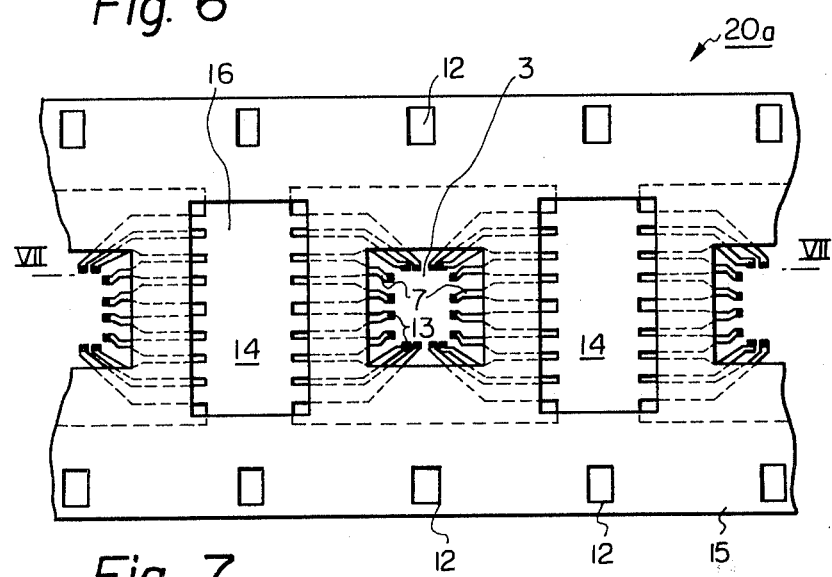
FIG. 6 is a plan view of another example of a tape-carrier according to the present invention.
Figure 7:
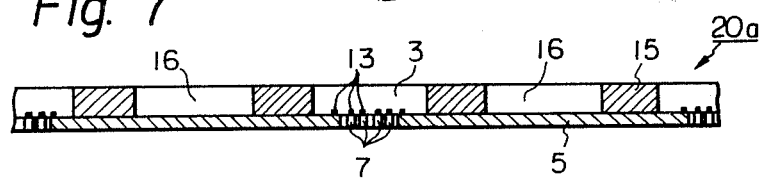
FIG. 7 is a sectional view along the line VII—VII in FIG. 6.

Another tape-carrier 20a according to the present invention is illustrated in FIG. 6 and FIG. 7. The tape-carrier 20a is manufactured as follows. In this case the bumps and the lead terminals are formed before assembling the tape and the copper foil.

Firstly, a copper foil 5 of about 35 μm in thickness is process by a cutting mechine to be cut so that the width of the copper foil 5 is made to be equal to that of a polyimide tape 15. A row of sprocket holes 12 is formed along each edge of the copper foil strip 5 by a punching machine. A photosensitive resist is coated on both surfaces of the copper foil strip 5. The thickness of the resist layer is about 10 μm.

Then, the copper strip 5 is partially exposed in the same manner as that of the above-mentioned first example so that, on the upper surface of the copper strip 5, the resist is removed in the shape of bumps; while in the lower surface of the copper strip 5, the resist is removed from the outer region of the area where the lead terminals are to be formed.

After that, a plating process follows, in which the upper surface of the copper strip 5 is plated with gold so as to form bumps 13 on the copper strip 5.

The copper strip 5 is etched so that each of the lead terminals 7 has a gold bump formed thereon at its end. In this case, lead terminals 7 are interconnected with each other through a connecting bridge portion 14 of the copper strip 5, that is, each lead terminal 7 is extended from the bridge portion 14.

Then, the resist is removed from both surfaces of the copper strip 5.

Apart from the above-described process, a polyimide tape 15 about 150 μm in thickness and coated with a bonding agent is prepared. The tape 15 is punched so as to form sprocket holes 12, center holes 3, and rectangular holes 16. The rectangular holes 16 are formed for cutting the lead terminals 7. The above-mentioned processed copper strip 5 is pressed together with this tape 15 to form a prescribed relative positional relationship. An accurate relative positioning between the tape 15 and the copper strip 5 can be achieved by aligning the sprocket holes 2 of the tape 9 with the sprocket holes 12 of the copper strip 5.

As described above, the process of manufacturing the tape-carrier 20a which comprises bumps 13 for bonding an IC chip onto the lead terminals is accordingly completed.

The bridge portion 14 of the copper strip may be cut off by a punching machine after the tape-carrier 20a is produced, or the bridge portion may be removed with the tape 15 at the time of cutting the tape 15 after bonding the IC chip onto the lead terminals.

The material for forming the bumps is not limited to gold. Tin, copper, silver, solder, or alloys of such metals can be used as the metal for forming a bump. In the case where the pump metal is etched during the process for etching the copper foil strip, the resist is again coated onto the surface where the bump metal is exposed.

As mentioned above, in the tape-carrier manufactured by the method according to the present invention, a bump is formed on the end of each of the lead terminals in a prescribed position with a high degree of accuracy. Each of the lead terminals is formed in an accurate position relative to the tape. The tape-carrier can be automatically manufactured in sequence so that the cost of producing the tape-carrier is reduced. Various types of IC chips which are not provided with bumps on the terminals thereof can be bonded to the lead terminals of the tape carrier by a thermo-compression gang-bonding method. As a result, IC elements can be produced easily and efficiently, and the cost of producing the IC elements can be reduced.

The present invention is not limited to the above-mentioned examples, but can be modified in many ways within the scope of the claims.

What is claimed is:

1. A method of making a tape-carrier for manufacturing IC elements comprising:
   a resist coating process for coating a layer of resist onto each surface of a metallic foil;

an alignment process in which said foil is inserted between two masks, a first having pump patterns therein and the second having patterns for lead terminals therein, said masks being in predetermined alignment with each other and said masks respectively contacting said resist layers;

an exposure process in which each said resist layer is exposed for removing portions of the second resist layer to form terminal leads from said metallic film for connection to respective terminals of an IC chip and for removing portions of the first resist layer where bumps are to be formed on said lead terminals for connection to the IC chip terminals;

a plating process for selectively plating a metal at said removed portions of said first resist layer to form said metallic bumps on said metallic foil, an etching process for etching said metallic foil exposed by said portions of said second resist layer to form said lead terminals with said bumps on the end portions thereof; and a resist removing process for removing the remaining portions of the resist layers from both surfaces of said metallic foil so that each of said bumps is entirely exposed on each respective lead terminal.

2. A method of making a tape-carrier for manufacturing IC elements comprising:

an adhesion process for attaching a flexible tape of an insulation material onto a metallic foil so as to form a strip assembly, said tape having a row of center holes and a row of sprocket holes located at regular intervals along each edge of said tape;

a resist coating process for coating a resist layer onto each surface of said strip assembly;

a mask-positioning process for positioning a mask having bump patterns therein and a mask having lead terminal patterns therein so as to face each other in a predetermined manner such that said bump patterns are aligned in each said center hole of said tape in orientation with the inner ends of said lead terminal patterns, and for feeding said strip assembly into a gap between said two masks by means of a feed device which engages with said sprocket holes of said tape, said masks respectively contacting said resist layers;

a resist patterning process for exposing both surfaces of said strip assembly through said masks, respectively, and for removing portions of a first one of said resist layers are where said bumps are to be formed, and for removing portions of the second resist layer where said lead terminals are to be formed;

a plating process for plating said metallic film where the bumps are to be formed by means of the remaining portions of said first resist layer;

an etching process for etching said metallic film by means of the remaining portions of said second resist layer where said lead terminals are to be formed with said bumps on the end portions thereof; and a resist removing process for removing said remaining portions of said resist layers from the surfaces of said strip assembly so that each of said bumps is entirely exposed on each said lead terminal.

3. A method of making a tape-carrier for manufacturing IC elements comprising:

a resist coating process for coating a resist directly onto each surface of a metallic foil strip which has a row of sprocket holes along each edge of said strip;

a metallic foil strip setting process in which said strip is inserted between two masks, one of said masks having bump patterns therein and the other having lead terminal patterns therein, said masks being aligned with each other and said masks respectively contacting said resist layers;

a resist patterning process, in which said both surfaces of the metallic foil strip are exposed to remove said resist from portions of a first one of said resist layers where said bumps are to be formed on said metallic foil strip, and to remove portions of the second resist layer where said lead terminals are to be formed from said metallic foil strip;

a plating process for forming metallic bumps on said metallic foil strip by plating through the remaining portions of said first resist layer;

an etching process for etching said metallic foil strip shape said lead terminals so as to have said bumps formed on the end portions thereof;

a resist removing process for removing the remaining portions of said resist layers from both surfaces of said metallic foil strip so that each of said bumps is entirely exposed on its respective lead terminal; and an adhesion process for attaching said processed metallic foil strip to a flexible tape of an insulation material, said tape having at least 1) a row of sprocket holes located at the same intervals as the intervals of the sprocket holes in said metallic foil strip and 2) a row of central holes, said ends of said terminals having said bumps being located in each said central hole, said process being achieved by aligning said sprocket holes of said metallic foil strip with said sprocket holes of said tape.

4. The process of claim 1, 2 or 3 comprising exposing both of said resist layers through the respective masks simultaneously.

5. The process of claim 1, 2 or 3, said plating process comprising placing said resist layers in contact with respective plates, each said plate comprising vinyl chloride, the one of said plates contacting said resist layer on the side of said metallic foil strip where said bumps are to be plated comprising a cavity over the area where said bumps are to be formed for containing a material for said plating.

6. The process of claim 2, said foil strip having a width that is less than the inside distance between said sprocket holes at each edge of said tape.

7. The process of claim 1, 2 or 3, said foil strip being of tin, copper, silver, solder, or alloys thereof.

8. The process of claim 1, 2 or 3 comprising forming each said terminal from said foil strip to have a cross section at said bump of as small as approximately 100 microns width and 35 microns thickness.

9. The process of claim 1, 2 or 3, said contacting of said resist layers with said mask comprising evacuating the air therebetween.

* * * * *

UNITED STATES PATENT AND TRADEMARK OFFICE
CERTIFICATE OF CORRECTION

PATENT NO. : 4,259,436
DATED : March 31, 1981
INVENTOR(S) : Tabuchi et al.

It is certified that error appears in the above—identified patent and that said Letters Patent is hereby corrected as shown below:

[54] In the title: "TAKE-CARRIER" should be --TAPE-CARRIER--.
*[57] In the Abstract: line 11, "are" should be --is--.
 Column 1, line 2, "TAKE-CARRIER" should be --TAPE-CARRIER--;
          line 43, "manufature" should be --manufacture--;
          line 59, "mis-alignment" should be --misalignment--.
*Column 3, line 22, "width" should be --widths--;
          line 49, after "prescribed" insert --position--;
          line 53, "ends" should be --end--;
          line 62, "process" should be --processed--; "mechine" should be --machine--.
 Column 4, line 44, "pump" should be --bump--.
 Column 5, line 2, "pump" should be --bump--;
          *line 16, "," should be --;--;
          *line 49, delete "are", first occurrence.
*Column 6, line 24, before "shape" insert --to--;
          *line 41, after "3" insert --,--;
          *line 57, after "3" insert --,--.

Signed and Sealed this

Fourth Day of August 1981

[SEAL]

Attest:

GERALD J. MOSSINGHOFF

Attesting Officer     Commissioner of Patents and Trademarks